United States Patent
Motoyama et al.

(10) Patent No.: US 12,347,767 B2
(45) Date of Patent: Jul. 1, 2025

(54) STACKED FET CONTACT FORMATION

(71) Applicant: INTERNATIONAL BUSINESS MACHINES CORPORATION, Armonk, NY (US)

(72) Inventors: Koichi Motoyama, Clifton Park, NY (US); Ruilong Xie, Niskayuna, NY (US); Jennifer Church, Albany, NY (US); Oleg Gluschenkov, Tannersville, NY (US)

(73) Assignee: INTERNATIONAL BUSINESS MACHINES CORPORATION, Armonk, NY (US)

( * ) Notice: Subject to any disclaimer, the term of this patent is extended or adjusted under 35 U.S.C. 154(b) by 491 days.

(21) Appl. No.: 17/951,739

(22) Filed: Sep. 23, 2022

(65) Prior Publication Data

US 2024/0105590 A1    Mar. 28, 2024

(51) Int. Cl.
| | |
|---|---|
| *H01L 23/522* | (2006.01) |
| *H01L 21/768* | (2006.01) |
| *H01L 23/528* | (2006.01) |
| *H01L 23/532* | (2006.01) |
| *H10D 86/01* | (2025.01) |

(52) U.S. Cl.
CPC .... *H01L 23/5226* (2013.01); *H01L 21/76805* (2013.01); *H01L 21/76819* (2013.01); *H01L 23/5283* (2013.01); *H01L 23/5286* (2013.01); *H01L 23/53295* (2013.01); *H10D 86/011* (2025.01)

(58) Field of Classification Search
CPC . H01L 23/5226; H10D 84/85; H10D 84/0149
USPC .......................................................... 257/518
See application file for complete search history.

(56) References Cited

U.S. PATENT DOCUMENTS

| | | |
|---|---|---|
| 9,659,963 B2 | 5/2017 | Cheng et al. |
| 9,837,414 B1 | 12/2017 | Balakrishnan et al. |
| 10,192,867 B1 | 1/2019 | Frougier et al. |
| 10,304,832 B1 | 5/2019 | Chanemougame et al. |
| 10,332,588 B2 | 6/2019 | Huynh Bao et al. |
| 10,756,096 B2 | 8/2020 | Paul et al. |
| 11,171,136 B2 | 11/2021 | Kim et al. |
| 11,211,452 B1 | 12/2021 | Xie et al. |
| 11,295,985 B2 | 4/2022 | Zhang et al. |
| 2012/0306082 A1 | 12/2012 | Sekar et al. |
| 2019/0371886 A1 | 12/2019 | Radosavljevic et al. |

(Continued)

OTHER PUBLICATIONS

International Search Report from PCT/IB2023/058527 dated Nov. 8, 2023. (8 pages).

*Primary Examiner* — Quoc D Hoang
(74) *Attorney, Agent, or Firm* — Tutunjian & Bitetto, P.C.; Matt Zehrer

(57) ABSTRACT

Semiconductor devices and methods of making the same include a first lower device and a second lower device on a substrate. A first upper device is over the first lower device and a second upper device is over the second lower device. A first lower contact extends from a height above the first upper device and makes electrical contact with a top surface and a sidewall surface of the first lower device. A second lower contact extends from a height above the second upper device and makes electrical contact with a top surface and a sidewall surface of the second lower device. An insulating barrier is between the first lower contact and the second lower contact.

9 Claims, 8 Drawing Sheets

(56) References Cited

U.S. PATENT DOCUMENTS

| | | |
|---|---|---|
| 2020/0035691 A1 | 1/2020 | Reznicek et al. |
| 2020/0091156 A1 | 3/2020 | Sharma et al. |
| 2020/0273755 A1 | 8/2020 | Wu et al. |
| 2020/0411433 A1 | 12/2020 | Lilak et al. |
| 2021/0202499 A1* | 7/2021 | Gardner ............. H10D 84/0167 |

* cited by examiner

STACKED FET CONTACT FORMATION

BACKGROUND

The present invention generally relates to semiconductor device fabrication and, more particularly, to stacked transistor devices.

Forming transistor devices over one another can help to increase the areal density of integrated circuits, for example by forming complementary field effect transistors that use two connected devices of opposite polarity. However, when forming transistor devices over one another, forming contacts to the underlying device can be challenging, particularly with tight pitches between horizontally adjacent devices. When forming stacked devices, a contact may need to penetrate multiple layers to reach the underlying device. While a large surface area at the interface between the contact and the device is helpful to decrease electrical resistance, increasing the size of the lower device can be difficult with neighboring devices close by. Furthermore, electrical contacts that are formed for devices that are very close together create a risk of an electrical short between the contact and the upper device, as well as a risk of creating a short to a neighboring device.

SUMMARY

A semiconductor device includes a first lower device and a second lower device on a substrate. A first upper device is over the first lower device and a second upper device is over the second lower device. A first lower contact extends from a height above the first upper device and makes electrical contact with a top surface and a sidewall surface of the first lower device and extends laterally underneath the first upper device. A second lower contact extends from a height above the second upper device and makes electrical contact with a top surface and a sidewall surface of the second lower device and extends laterally underneath the second upper device. A first lower contact extends from a height above the first upper device and makes electrical contact with a top surface and a sidewall surface of the first lower device. A second lower contact extends from a height above the second upper device and makes electrical contact with a top surface and a sidewall surface of the second lower device. An insulating barrier is between the first lower contact and the second lower contact. The insulating barrier provides reliable electrical separation between the contacts to the lower devices without risking a short between adjacent structures. Additionally, the lateral extension of the lower contacts, underneath the upper devices, increases the surface area of the interface between the lower contacts and the lower devices, which reduces resistance.

A method of forming a semiconductor device includes forming a placeholder structure over a first lower device and a second lower device on a substrate. A first upper device and a second upper device are formed on a dielectric layer over the respective first lower device and second lower device. The placeholder structure is selectively etched away to expose a top surface and a sidewall surface of each of the first lower device and the second lower device. A conductive material is deposited that makes electrical contact with the top surface and the sidewall surface of each of the first lower device and the second lower device. A trench is etched in the conductive material that separates the conductive material into a first lower contact and a second lower contact. A barrier structure is formed in the trench to electrically isolate the first lower contact and the second lower contact. The barrier structure provides reliable electrical separation between the contacts to the lower devices without risking a short between adjacent structures. Additionally, the placeholder structure creates a space for lateral extension of the lower contacts, underneath the upper devices, which increases the surface area of the interface between the lower contacts and the lower devices and reduces resistance.

A method of forming a semiconductor device includes forming a placeholder structure over and between a pair of lower devices. A dielectric layer is formed over the placeholder structure. The placeholder structure is etched away to leave a gap between the pair of lower devices and the dielectric layer. A conductor is deposited to fill the gap. A trench is etched in the conductor to form contacts to each of the pair of lower devices. The trench provides reliable electrical separation between the contacts to the lower devices without risking a short between adjacent structures. Additionally, the placeholder provides lateral extension for the lower contacts, underneath the upper devices, which increases the surface area of the interface between the lower contacts and the lower devices and reduces resistance.

These and other features and advantages will become apparent from the following detailed description of illustrative embodiments thereof, which is to be read in connection with the accompanying drawings.

BRIEF DESCRIPTION OF THE DRAWINGS

The following description will provide details of preferred embodiments with reference to the following figures wherein.

DETAILED DESCRIPTION

Stacking field effect transistors (FETs) can increase the areal density of an integrated chip, with devices being formed on multiple vertically stacked layers of the chip. To make electrical contact to buried devices, vias may be formed that pierce through overlying layers. The vias may be filled with conductive material that makes contact with the underlying device(s).

However, when forming devices close to one another, the conductive vias to the lower devices may be made thin to reduce the risk of creating shorts between neighboring devices. Thinner vias are more likely to include defects, such as voids in their metal fill, which can interfere with device functionality. Additionally, narrow vias can reduce contact area between the via and the underlying device, as placement of the via may be challenging. Electrical contact to the sidewalls of the underlying device may also be challenging, which further reduces potential electrical contact area.

Rather than using narrow vias, contacts to the lower devices can be formed by splitting a relatively thick via into two contacts that connect to different respective devices. The thick via may be etched to form a trench that separates the conductive material into two separate vias, with a dielectric liner being formed between them to prevent shorts. The relatively thick original contact structure reduces the risk of voids in the deposition of the conductive material and furthermore makes it possible to make electrical contact along the sidewall of the lower device, reducing contact resistance.

Figure 1:
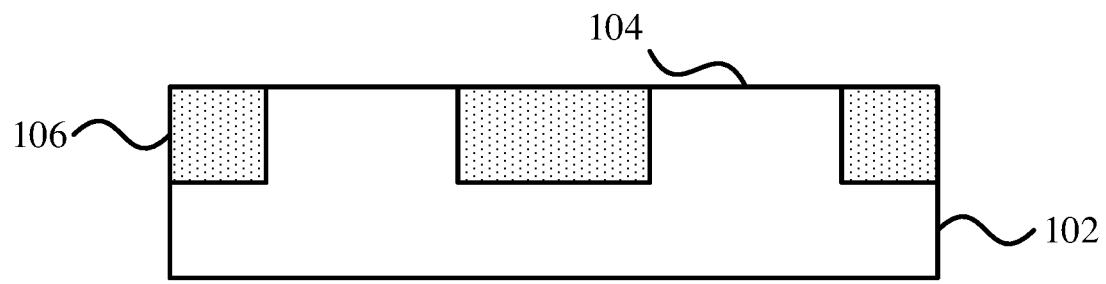
FIG. 1 is a cross-sectional view of a step in the fabrication of contacts to a set of vertically stacked semiconductor devices, showing the formation of distinct device platform regions on a semiconductor substrate using shallow trench isolation, in accordance with an embodiment of the present invention.

Referring now to FIG. 1, a cross-sectional view of a step in the fabrication of stacked semiconductor devices is shown. A semiconductor substrate 102 is shown, divided into device regions 104 by shallow trench isolation (STI) regions 106. The device regions 104 establish locations where semiconductor devices may be formed in subsequent steps.

The semiconductor substrate 102 may be a bulk-semiconductor substrate. In one example, the bulk-semiconductor substrate may be a silicon-containing material. Illustrative examples of silicon-containing materials suitable for the bulk-semiconductor substrate include, but are not limited to, silicon, silicon germanium, silicon germanium carbide, silicon carbide, polysilicon, epitaxial silicon, amorphous silicon, and multi-layers thereof. Although silicon is the predominantly used semiconductor material in wafer fabrication, alternative semiconductor materials can be employed, such as, but not limited to, germanium, gallium arsenide, gallium nitride, cadmium telluride, and zinc selenide. Although not depicted in the present figures, the semiconductor substrate 102 may also be a semiconductor on insulator (SOI) substrate.

The STI regions 106 may be formed by any appropriate process. For example, a photolithographic patterning process may be used to define a mask that covers the device regions 104, leaving other portions of the substrate 102 exposed. A timed, selective anisotropic etch, such as a reactive ion etch (RIE) may be used to remove substrate material in the exposed regions, leaving trenches in the substrate 102. The trenches in the substrate 102 may then be filled using any appropriate dielectric material, such as silicon dioxide, which may be deposited using a chemical vapor deposition (CVD) process and which may then be polished down to the level of the top surface of the substrate 102 (or any other appropriate height) using a chemical mechanical planarization (CMP) process.

In photolithographic processes, a pattern is produced by applying a photoresist to the surface to be etched. The photoresist to a pattern of radiation. A pattern is then developed into the photoresist utilizing a resist developer. Once the patterning of the photoresist is completed, the sections covered by the photoresist are protected while the exposed regions are removed using a selective etching process that removes the unprotected regions.

RIE is a form of plasma etching in which during etching the surface to be etched is placed on a radio-frequency powered electrode. Moreover, during RIE the surface to be etched takes on a potential that accelerates the etching species extracted from plasma toward the surface, in which the chemical etching reaction is taking place in the direction normal to the surface. Other examples of anisotropic etching include ion beam etching, plasma etching or laser ablation.

As used herein, the term "selective" in reference to a material removal process denotes that the rate of material removal for a first material is greater than the rate of removal for at least another material of the structure to which the material removal process is being applied.

CMP may be performed using, e.g., a chemical or granular slurry and mechanical force to gradually remove upper layers of the device. The slurry may be formulated to be unable to dissolve, for example, the work function metal layer material, resulting in the CMP process's inability to proceed any farther than that layer.

Figure 2:
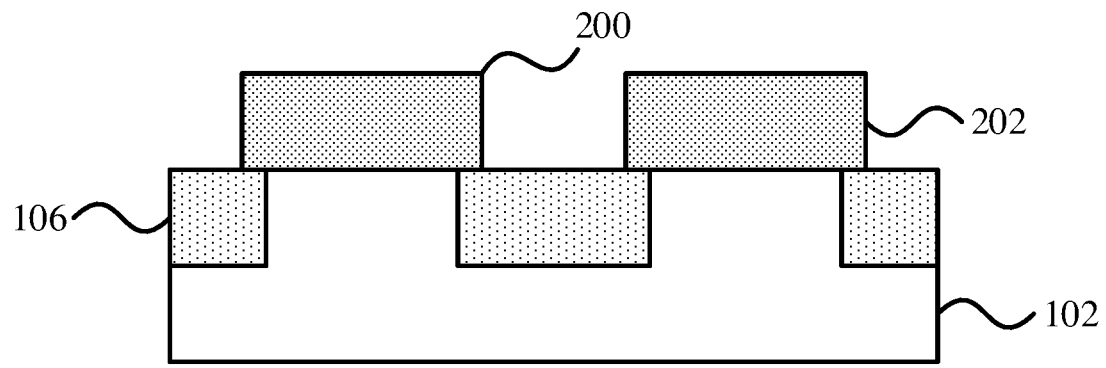
FIG. 2 is a cross-sectional view of a step in the fabrication of contacts to a set of vertically stacked semiconductor devices, showing the formation of a pair of lower devices on the respective device plateau regions of the semiconductor substrate, in accordance with an embodiment of the present invention.

Referring now to FIG. 2, a cross-sectional view of a step in the fabrication of stacked semiconductor devices is shown. A set of lower devices 200 are formed on the respective device regions 104 of the substrate 102. This cross-section shows a cut that goes through a source/drain portion 202 of the devices 200, and it should be understood that other portions of the device, such as the channel and gate stack, are present but not shown.

The source/drain portions 202 may be formed from epitaxially grown semiconductor material that extends laterally from the channels of the devices 200. For example, the devices 200 may be nanosheet FETs, where thin sheets of semiconductor material are formed in a vertically stacked arrangement, with a gate stack between and around the thin sheets of semiconductor material and with the epitaxially grown source/drain material conductively linking the sheets into respective transistor devices. Other types of device are also contemplated, including fin FETs and nanowire FETs, which use different channel geometries.

As used herein, the terms "epitaxial growth" and/or "epitaxial deposition" refer the growth of a semiconductor material on a deposition surface of a semiconductor material, in which the semiconductor material being grown has substantially the same crystalline characteristics as the semiconductor material of the deposition surface. The term "epitaxial material" denotes a material that is formed using epitaxial growth. In some embodiments, when the chemical reactants are controlled and the system parameters set correctly, the depositing atoms arrive at the deposition surface with sufficient energy to move around on the surface and orient themselves to the crystal arrangement of the atoms of the deposition surface. Thus, in some examples, an epitaxial film deposited on a {100} crystal surface will take on a {100} orientation.

The devices 200 may be formed from any appropriate semiconductor material. For example, the nanosheet channels (not shown) of the devices 200 may be formed from silicon or silicon germanium, and the source/drain portions 202 may be formed from the same semiconductor material or a similar, compatible material that may include n-type or p-type dopants. The source/drain portions 202 may be doped in situ during formation, or may be doped afterward by an ion implantation process.

Figure 3:
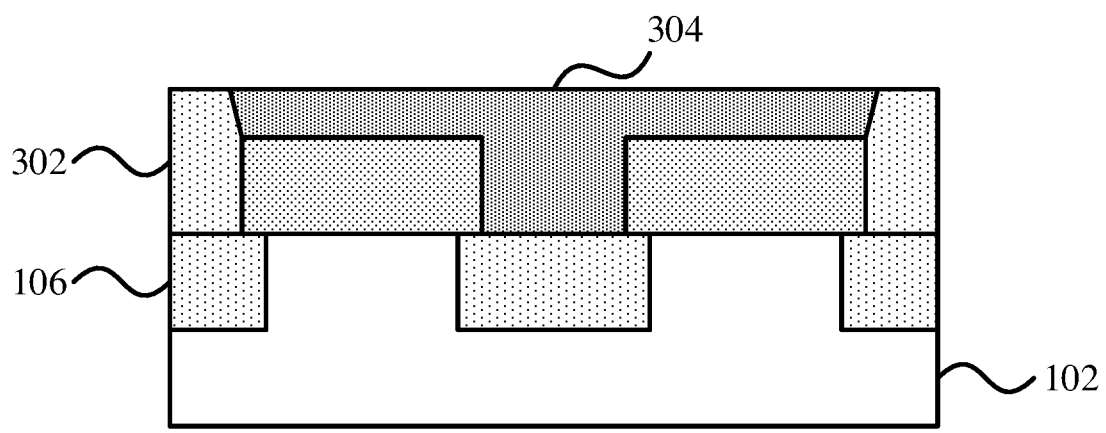
FIG. 3 is a cross-sectional view of a step in the fabrication of contacts to a set of vertically stacked semiconductor devices, showing the formation of a sacrificial placeholder structure that makes contact with a top and side surface of each of the lower devices, in accordance with an embodiment of the present invention.

Referring now to FIG. 3, a cross-sectional view of a step in the fabrication of stacked semiconductor devices is shown. An interlayer dielectric 302 is deposited over and around the devices 200, to a height above the height of the devices 200. The interlayer dielectric 302 may be formed from any appropriate dielectric material, such as silicon dioxide, and may be deposited using any appropriate deposition process. Although CVD is specifically contemplated, any other deposition process may be used instead, such as atomic layer deposition (ALD), physical vapor deposition (PVD), or gas cluster ion beam (GCIB) deposition.

CVD is a deposition process in which a deposited species is formed as a result of chemical reaction between gaseous reactants at greater than room temperature (e.g., from about 25° C. about 900° C.). The solid product of the reaction is deposited on the surface on which a film, coating, or layer of the solid product is to be formed. Variations of CVD processes include, but are not limited to, Atmospheric Pressure CVD (APCVD), Low Pressure CVD (LPCVD), Plasma Enhanced CVD (PECVD), and Metal-Organic CVD (MOCVD) and combinations thereof may also be employed. In alternative embodiments that use PVD, a sputtering apparatus may include direct-current diode systems, radio frequency sputtering, magnetron sputtering, or ionized metal plasma sputtering. In alternative embodiments that use ALD, chemical precursors react with the surface of a material one at a time to deposit a thin film on the surface. In alternative embodiments that use GCIB deposition, a high-pressure gas is allowed to expand in a vacuum, subsequently condensing into clusters. The clusters can be ionized and directed onto a surface, providing a highly anisotropic deposition.

A portion of the interlayer dielectric 302 may be etched away, for example using a photolithographic patterning process and a selective anisotropic etch, such as RIE. The etch may form a gap that exposes the top surfaces of the devices 200. Although it is shown that the entire top surfaces of the devices 202 may be exposed by the gap, it should be understood that any amount of the top surfaces may be exposed.

The gap may then be filled by a placeholder material, selected to be selectively etchable with respect to the devices 200 and the interlayer dielectric 302. The placeholder material may be deposited by any appropriate process, such as CVD, and may be polished down to the level of the top surface of the interlayer dielectric 302 using a CMP process to form placeholder 304. Exemplary placeholder materials may include titanium oxide or aluminum oxide, which can be cleanly removed without damaging the semiconductor structures of the devices 200.

It is specifically contemplated that the placeholder structure 304 may be limited to a region above and between the source/drain portions 202 of the devices 200. The placeholder structure 304 defines an area where a lower contact will eventually be formed, so the placeholder structure should not contact more than one region of a particular device 200 unless those contacted regions are meant to be electrically connected to one another. Thus, the placeholder structure 304 may contact the source, drain, or gate of the lower devices 200, and in some cases may contact the gate and one of the source and drain region, but in most cases may not contact all three regions.

Figure 4:
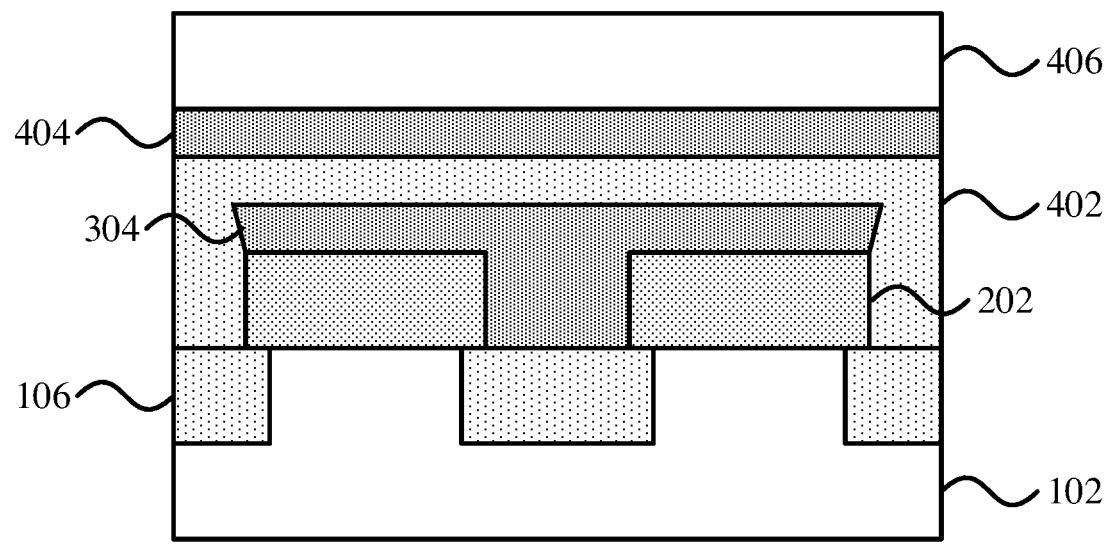
FIG. 4 is a cross-sectional view of a step in the fabrication of contacts to a set of vertically stacked semiconductor devices, showing the formation of an upper layer over the placeholder structure, in accordance with an embodiment of the present invention.

Referring now to FIG. 4, a cross-sectional view of a step in the fabrication of stacked semiconductor devices is shown. Additional interlayer dielectric material is deposited over the placeholder 304 to form interlayer dielectric 402, raising the height of the interlayer dielectric 402 above the placeholder structure 304. A bonding layer 404 is then deposited over the interlayer dielectric 402 using any appropriate deposition process, for example being formed from an appropriate dielectric oxide material. A layer of semiconductor material 406 is then deposited over the bonding layer 404 by any appropriate process. The layer of semiconductor material 406 is used in subsequent steps to form an upper layer of devices.

Figure 5:
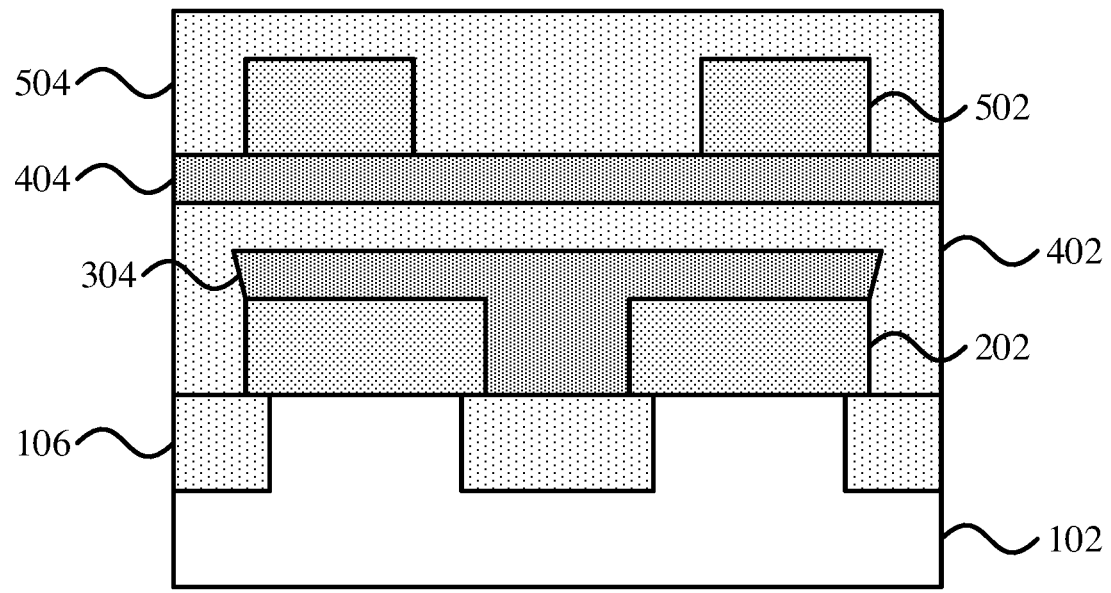
FIG. 5 is a cross-sectional view of a step in the fabrication of contacts to a set of vertically stacked semiconductor devices, showing the formation of upper semiconductor devices in the upper layer, vertically aligned over the respective lower devices, in accordance with an embodiment of the present invention.

Referring now to FIG. 5, a cross-sectional view of a step in the fabrication of stacked semiconductor devices is shown. The layer of semiconductor material 406 is processed to form upper devices 502. As with the lower devices 200, this cross-sectional view shows a cut through the source/drain portions of the upper devices 502. The upper devices 502 may be fabricated with a similar process to the lower devices 200 or may be different. For example, the upper devices 502 may be FETs formed around a fin channel structure, or many include nanosheet or nanowire channel structures. As with the lower devices 200, the upper devices 502 may include any appropriate gate stack and source/drain composition. An upper interlayer dielectric 504 may be formed over and around the upper devices 502 using any appropriate deposition method and dielectric material, to a height above the height of the upper devices 502.

Figure 6:
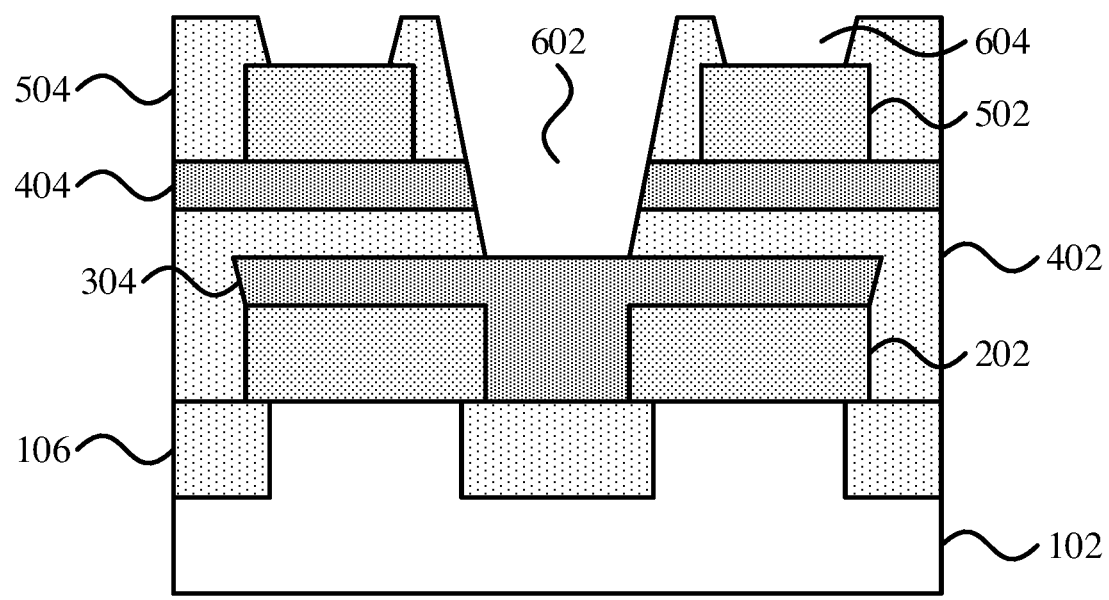
FIG. 6 is a cross-sectional view of a step in the fabrication of contacts to a set of vertically stacked semiconductor devices, showing an etch that penetrates through the upper layer and that exposes at top surface of the placeholder structure, in accordance with an embodiment of the present invention.

Referring now to FIG. 6, a cross-sectional view of a step in the fabrication of stacked semiconductor devices is shown. Contact openings 602/604 are etched into the interlayer dielectrics 402 and 504 using any appropriate patterning process, followed by an anisotropic etch, such as RIE. For example upper contact openings 604 may be formed that expose top surfaces of the source/drain regions of the upper devices 502. A central contact opening 602 may also be formed, which penetrates the binding layer 404 and the interlayer dielectrics 402/504 to expose a top surface of the placeholder structure 304 in a region between the source/drain portions 202 of the lower devices 200.

The top surfaces of the source/drain regions of the upper devices 502 may be exposed, while the source/drain portions 202 of the lower devices 200 are protected by the placeholder structure 304. The exposed source/drain surfaces can be selectively modified to make a good electrical contact for the upper devices.

Electrical contacts between dissimilar conductive materials may have an interfacial contact resistance that impedes electrical current. The interfacial contact resistance is inversely proportional to the contact area and is proportional to an interfacial material property referred to as the specific contact resistivity. Specific contact resistivity between elemental metals may be in the range of 1e-12 to 1e-11 $\Omega\text{-cm}^2$ range. Between metallic compounds, such as silicides, germanosilicides, and metal nitrides or carbides, the specific contact resistivity may be in the 1e-11 to 1e-10 $\Omega\text{-cm}^2$ range. Between doped semiconductors and metallic compounds or metals, the specific contact resistivity may be in the 3e-9 to 1e-7 $\Omega\text{-cm}^2$ range.

Because metal-semiconductor contact resistance dominates, an interface may be engineered to obtain a resistivity in the low e-9 $\Omega\text{-cm}^2$ range for the specific interfacial resistivity. Interfacial engineering may include addition of dopant atoms to the semiconductor surfaces and a nonequilibrium activation of the surface dopants, as well as forming suitable metallic compounds at the interface. Complementary metal-oxide-semiconductor (CMOS) technology may include at least two sets of electron devices of opposite polarity, such as n-type FETs (nFETs) and p-type FETs (pFETs). Interfacial contact engineering for these device sets may be different, as the surface modifiers that reduce the specific contact resistivity for one device type may degrade the specific contact resistivity for the other device type.

In one embodiment, the upper devices may have the same polarity. Accordingly, their exposed top source/drain surfaces may be modified by adding a surface dopant of the same polarity: such as boron, gallium, or indium for pFETs, or phosphorus, arsenic, or antimony for nFETs. Other elements may also be added to the top surfaces of the source/drain to further reduce specific contact resistivity. In one example, germanium and/or tin may be added for pFETs, or carbon, niobium, lanthanum, and/or scandium can be added for nFETs. These electrically neutral elements may reduce electrical carrier scattering at the semiconductor-metal interface and may help activate surface dopants via a nonequilibrium process. For instance, germanium and tin pin the semiconductor valence band to the metal Fermi level, reducing interfacial Schottky barrier for p-type contact. Niobium, lanthanum, and scandium may help reduce interfacial Schottky barrier for the n-type contacts. Similar to the dopants of opposite polarity, these elements help only one device type and may degrade the other type.

Dopants and additional elements may be introduced to the exposed top surface of the source/drain via a low-temperature (<500 C) epitaxy, surface ion implantation, surface plasma treatment, and/or gas doping. From about 3 nm to about 10 nm of exposed top source/drain surfaces may be modified at the end of this process step. Conditions of low-temperature epitaxy may be selected to enable a selective growth, such that there is no continuous grown film present on the structure 304 and other dielectric surfaces.

In one example, the low-temperature selective epitaxy may be a CVD process using high-order silicon or germanium precursors, such as disilane or digermane. Such high-order precursors enable a low-temperature (<500 C) epitaxial growth on exposed semiconductor surfaces that helps to preserve formed metastable surface compounds. Enhanced epitaxial selectivity can be achieved using in situ deposition-etch sequences.

The epitaxial growth process may also serve as a non-equilibrium dopant activation process, where the dopants are forced and locked into the semiconductor lattice substitutional sites. Alternatively, the surface dopants may need to be activated to yield a high-degenerate semiconductor with active electrical carriers (electrons or holes) of around 1e21 $cm^3$. A non-equilibrium dopant activation process may involve an amorphization of exposed top semiconductor surfaces with subsequent re-growth of the amorphized region. The re-growth process acts similarly to epitaxial growth, where dopants are locked into the semiconductor lattice substitutional sites during a thermally-driven rearrangement of atoms.

The surface amorphization process can be conducted through an ion implantation of dopants with correct polarity or electrically neutral elements such as argon, xenon, or germanium. Ion implantation can be conducted at sub-room temperature to enhance amorphization at low implantation doses. Ion implantation energy is selected to yield an amorphous layer of desired thickness but may be less than about 10 nm to avoiding interaction with internal device structures of the upper devices 502. Thermally-driven surface re-crystallization can be conducted immediately after, or at a later step in the process flow.

Short-duration anneals, such as laser or flash anneals, are preferred this re-crystallization process, with an exemplary duration ranging from tens of milliseconds to tens of nanoseconds, and the peak anneal temperature may be selected to complete re-crystallization. The re-crystallization process may involve melting of the top semiconductor surface, in some cases. In this embodiment, all exposed top source/drains surfaces of upper devices 502 may be modified with a chosen process sequence beneficial to the upper device 502 polarity. The top surface of the placeholder structure 304 in a region between the source/drain portions 202 of the lower devices 200 may remain exposed.

In other embodiments, upper devices 502 may be of mixed polarity, with both nFETs and pFETs present within the upper level. In such embodiments, the sequences for modifying top source/drain surfaces are different. Patterning may be used to block one device polarity and expose devices of the other polarity during a treatment step, followed by a new patterning for the next treatment. Blocking may involve using a suitable hard mask material, such as silicon nitride, that prevents nucleation of low-temperature CVD epitaxy. After sequential modification of exposed top source/drains surfaces of upper devices 502, with chosen process sequences beneficial for device of each polarity, the top surface of the placeholder structure 304 in a region between the source/drain portions 202 of the lower devices 200 remains exposed.

Figure 7:
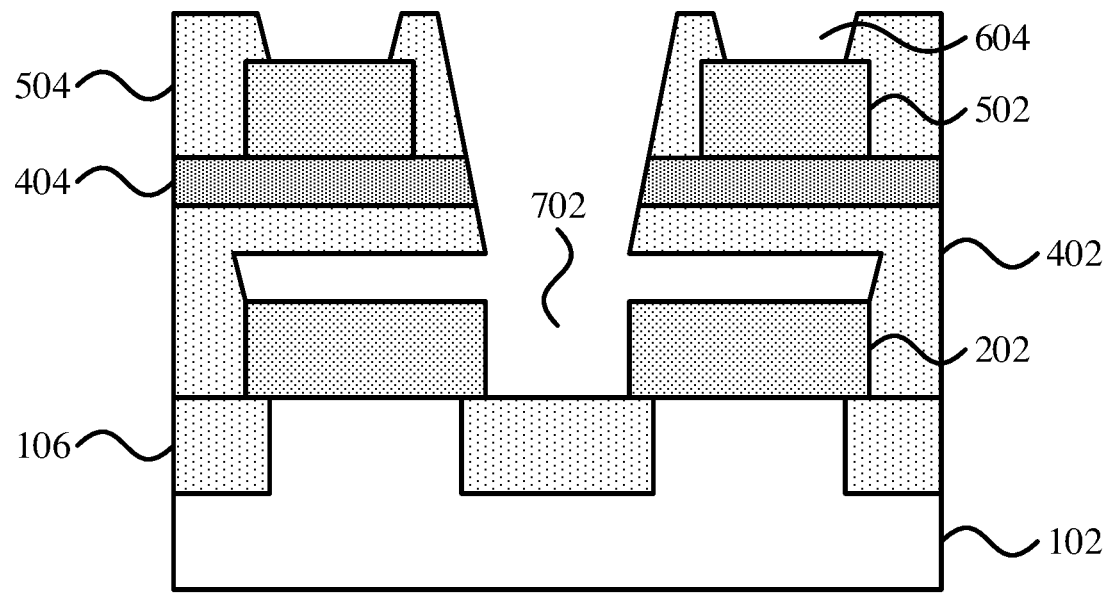
FIG. 7 is a cross-sectional view of a step in the fabrication of contacts to a set of vertically stacked semiconductor devices, showing an etch that removes of the placeholder structure to leave a gap that exposes the top and sidewall surfaces of the lower devices, in accordance with an embodiment of the present invention.

Referring now to FIG. 7, a cross-sectional view of a step in the fabrication of stacked semiconductor devices is shown. The placeholder structure 304, along with any contaminants introduced during the surface modification, is etched away using any appropriate isotropic etch, such as a wet or dry chemical etch. The etch removes material from between the lower source/drain structures 202 and the lower interlayer dielectric 402, exposing the top surfaces of the lower source/drain structures 202 as well as sidewalls of the lower source/drain structures 202, leaving gap 702. Thus the removal of the placeholder structure 304 creates a gap 702 over and between the source/drain structures 202, but may leave at least one sidewall of each of the lower source/drain structures 202 covered by lower interlayer dielectric 402.

The exposed surfaces of the lower source/drain structures 202 can be selectively modified to make a good electrical contact to the lower devices, with an exemplary specific contact resistivity at or below 1e-9 $\Omega$-cm$^2$. The surface modification processes may include chemical depositions and treatments that can penetrate into the gap 702 to modify exposed horizontal surfaces of the lower source/drain 202. Further, the presence of exposed and modified surfaces of the upper source/drain 502 puts an additional limitation to the surface modification processes of the lower source/drain structures, such that they do not interfere with forming an electrical contact to the upper source/drain structure 502 with the specific contact resistivity at or below 1e-9 $\Omega$-cm$^2$.

In one embodiment, all lower devices may have the same polarity. A low-temperature (<500 C) selective epitaxy may be employed to modify the surfaces of the lower source/drain 202 in accordance with its polarity as described above, while preserving modified surfaces of the upper source/drain structures 502 as well as the dielectric surfaces. The low-temperature epitaxy enables an epitaxial growth on the exposed semiconductor surfaces of the lower source/drain structures 202 while not growing on the modified surfaces of the upper source/drain structures due to different semiconductor materials employed in the source/drain structures of upper and lower devices, such as silicon versus silicon germanium. The epitaxy selectivity can be further enhanced by keeping the modified surfaces of the upper source/drain structures 502 amorphous after the ion implantation amorphization process and through this selective epitaxy step.

Even though the epitaxial growth is absent or impeded on the modified surfaces of the upper source/drain structures 501, the surfaces can be contaminated by dopants or elements of different polarity. Low temperature of the epitaxial growth limits this contamination to within 3 nm from the surface. A directional etch process, such as RIE, can be performed after selective epitaxial growth, removing contaminated surface material from the modified surfaces of the upper source/drain structure 502 while preserving grown epitaxy on the surfaces of lower source/drain strictures 202. The epitaxial growth process on the surfaces of the lower source/drain structures 202 may also serve as a non-equilibrium dopant activation process as alluded above. Short duration anneals such as laser or flash anneals can conducted to further activate dopants in the grown epitaxial layer and to re-crystallize any amorphous layers that may be still present in source/drain structures.

Figure 8:
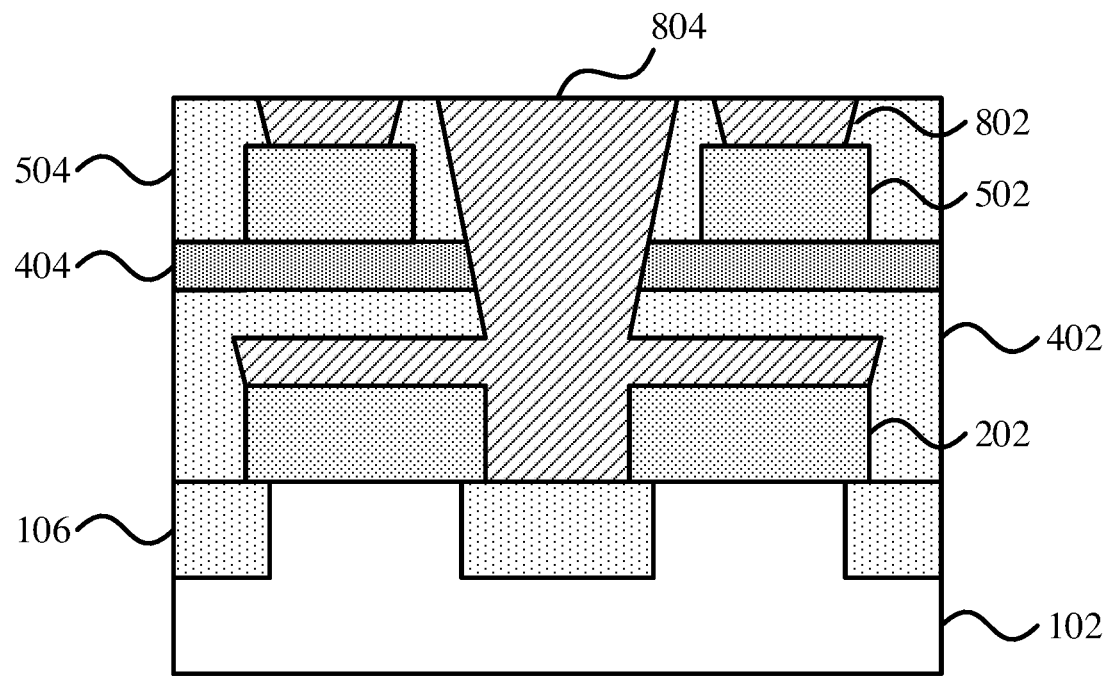
FIG. 8 is a cross-sectional view of a step in the fabrication of contacts to a set of vertically stacked semiconductor devices, showing the deposition of conductive material in the gap left by removing the placeholder structure to form a central contact structure, in accordance with an embodiment of the present invention.

Referring now to FIG. 8, a cross-sectional view of a step in the fabrication of stacked semiconductor devices is shown. First conductive material is deposited to form an interfacial contact with the modified semiconductor surfaces. The first conductive material can be in the form of a thin liner of just several nm thick. The purpose of the first conductive material is to form a suitable metallic compound at the interface with adjacent semiconductors such that the specific contact resistivity of these semiconductor-metal interfaces is low, for example lower than 1e-9 $\Omega$-cm$^2$. The bulk resistivity of the first conductive material is less important as long as it enables a low contact resistivity.

The first conductive material can be the same or different for lower and upper devices. In embodiments where the first conductive material is different for lower and upper devices, the first material type may be deposited first by a directional deposition process such as PVD, followed by a conformal deposition of the second material type using CVD or ALD processes. The first material type coats only exposed horizontal surfaces and absent within the gap 702 and on the vertical surfaces, while the second material type coats all surfaces. In embodiments where all upper devices are of the first polarity and all lower devices are of the second polarity, the type of first conductive material can be employed to independently lower the specific contact resistivity of semiconductor-metal interfaces of different polarities. For example, if all upper devices are pFETs and all lower devices are nFETs, the first material type can be PVD-deposited thin layer of nickel or platinum, while the second material type can be CVD-deposited thin layer of titanium. In this case, nFET contact interfaces will be between titanium silicide and degenerate n-type semiconductor, while pFET contact interfaces will be between nickel and/or platinum germanosilicide and degenerate p-type semiconductor.

In some embodiments, the first conductive material is the same for lower and upper devices. For example, if all upper devices are pFETs and all lower devices are nFETs, the common first conductive material can be CVD-deposited thin layer of titanium. In this case, nFET contact interfaces will be between titanium silicide and degenerate n-type semiconductor and pFET contact interfaces will be between titanium germanosilicide and degenerate p-type semiconductor.

A second conductive material may be deposited using a conformal deposition process, such as CVD or ALD, which coats the first conductive material in the upper trenches 604 and in the central trench 602 and the gap 702, filling the gap 702. The second conductive material fills these spaces, and may then be polished down to the level of the upper interlayer dielectric 504 to create composite upper contacts 802 and a composite central contact structure 804.

The second conductive material reduces the bulk resistance of the contact structures. Accordingly, the second conductive material may be selected from metals and metallic compounds with a low effective bulk resistivity (a bulk resistivity adjusted for small dimensions of trenches and gaps). The second conductive material of the upper contact composite structure 802 and the central contact composite structure 804 may be formed from any appropriate conductive metal such as, e.g., tungsten, nickel, titanium, molybdenum, tantalum, copper, platinum, silver, gold, ruthenium, iridium, rhenium, rhodium, cobalt, and alloys thereof. First and second conductors can be separated by a thin (e.g., <2 nm) conductive diffusion barrier to prevent intermixing. In some instances, the first and the second conductors can be made from the same material or alloy forming respective interfacial silicides and germanosilicides at semiconductor interfaces.

The central contact composite structure 804 makes electrical contact with both of the lower source/drain regions 202 along their top surfaces and along a sidewall thereof, enabling a low specific contact resistivity, in some instances, lower than 1e-9 $\Omega$-cm$^2$ over entire metal-semiconductor interface. Multiple metal-metal interfaces that may be present with the composite structure 804 do not significantly affect the overall contact resistance because metal-metal specific contact resistivity is at least an order of magnitude lower than that of semiconductor-metal interfaces. Because of the relatively large width of the central contact structure 804, the second conductor material with its low effective bulk resistivity enables a low bulk resistance. Few metal voids should result during the deposition process, improving the electrical contact between the central composite contact structure 804 and the source/drain structures 202 and reducing overall contact resistance.

At the same time, the upper contact composite structure 802 makes electrical contact with the upper source/drain regions 502, enabling a low specific contact resistivity, in some instances, lower than 1e-9 $\Omega$-cm$^2$, over the entire metal-semiconductor interface. Multiple metal-metal interfaces that may be present with the composite structure 802 do significantly affect the overall contact resistance, because metal-metal specific contact resistivity is at least an order of magnitude lower than that of semiconductor-metal interfaces. Because of the relatively low effective bulk resistivity of the second conductor material within composite structure 802 and the low specific contact resistivity of the interface with upper source/drain structure 502, the upper contact composite structure 802 provides an improved electrical contact to the upper source/drain structure 502 with a substantially reduced overall contact resistance.

Figure 9:
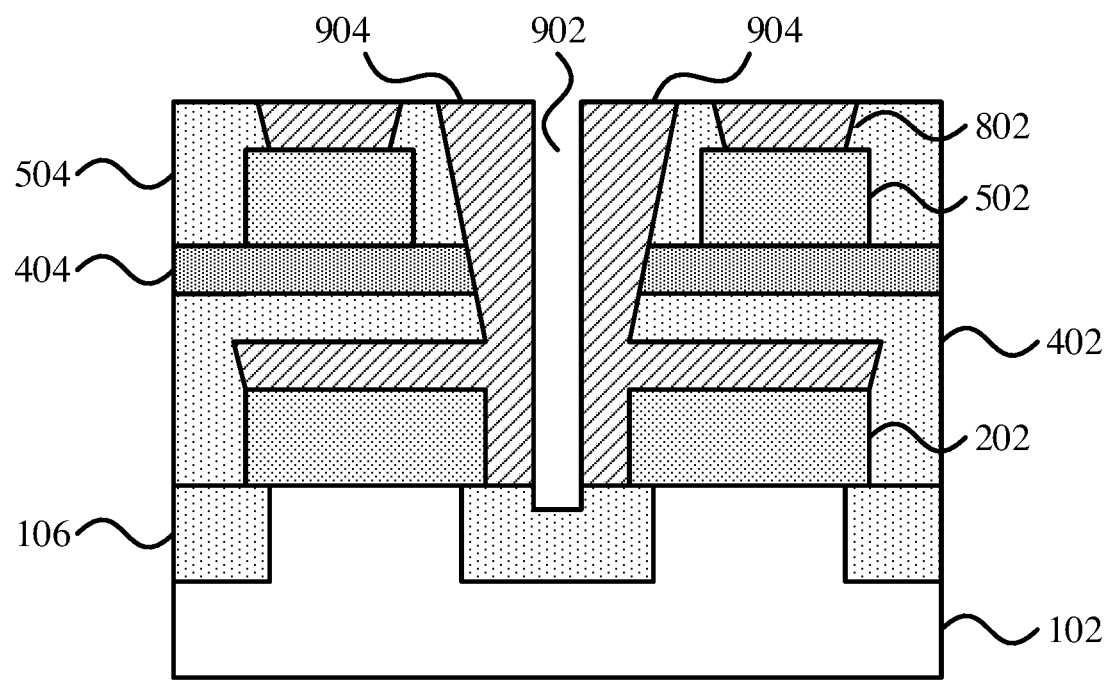
FIG. 9 is a cross-sectional view of a step in the fabrication of contacts to a set of vertically stacked semiconductor devices, showing the formation of a trench in the conductive material of the central contact structure to separate the central contact structure into two distinct contacts, in accordance with an embodiment of the present invention.

Referring now to FIG. 9, a cross-sectional view of a step in the fabrication of stacked semiconductor devices is shown. A trench 902 is etched down through the central contact structure 804 and into the underlying STI region 106 using any appropriate patterning process and anisotropic etch. The etch may include a non-selective etch that removes material from both the central contact structure and the STI region 106, or may include two separate etches that are respectively selective to the conductive material of the central contact structure 804 and the STI region 106. The trench 902 separates the central contact structure 804 into two vias/contacts 904, each of which makes electrical contact with a respective lower source/drain portion 202. The trench 902 electrically isolates the two lower devices 200 from one another.

Although the trench 902 is shown as being positioned along a center line of the central contact structure 804, such that the resulting vias/contacts 904 are of roughly equal size, it should be understood that the trench 902 may be positioned off-center instead. The position of the trench 902 may be selected to provide vias/contacts 904 that align with signal or power lines in a subsequently added overlying back-end-of-line (BEOL) layer. Such alternative embodiments are illustrated with respect to FIG. 13.

Figure 10:
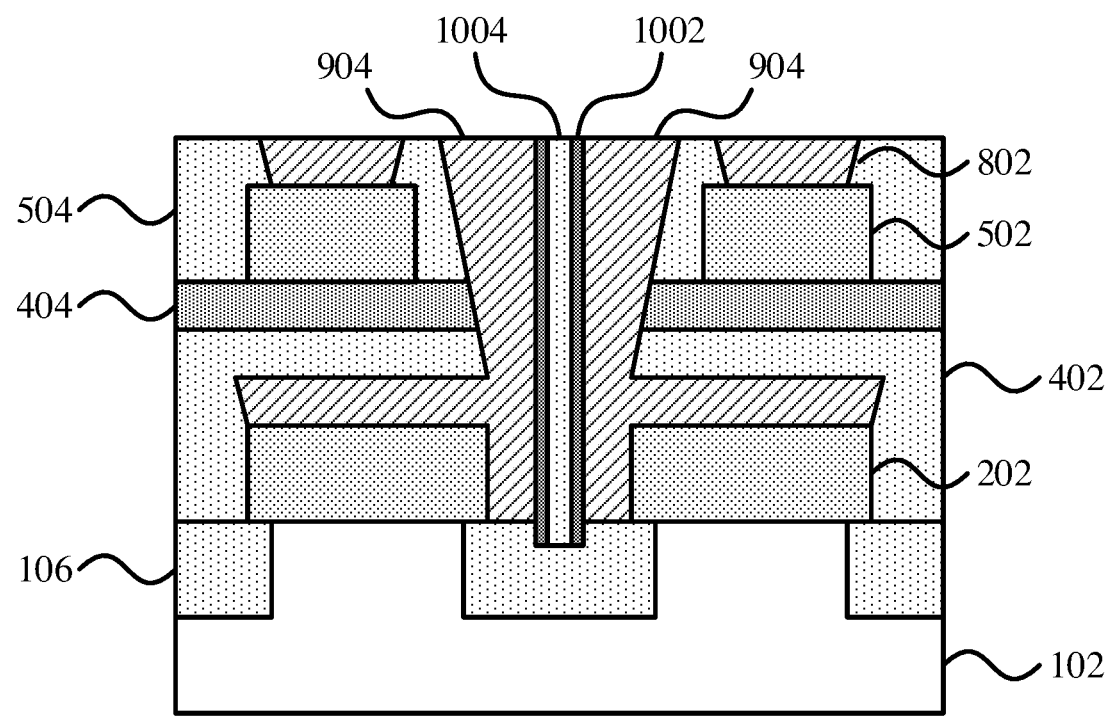
FIG. 10 is a cross-sectional view of a step in the fabrication of contacts to a set of vertically stacked semiconductor devices, showing the formation of an electrical barrier structure in the trench that provides further electrical insulation between the two contacts, in accordance with an embodiment of the present invention.

Referring now to FIG. 10, a cross-sectional view of a step in the fabrication of stacked semiconductor devices is shown. The trench 902 is filled with an electrically insulating structure that includes a dielectric liner 1002 and an interlayer dielectric fill 1004. The dielectric liner 1002 and the interlayer dielectric fill 1004 may be respectively formed using any appropriate conformal deposition processes, such as CVD or ALD. Before the interlayer dielectric fill 1004 is deposited, the deposited liner material may be removed from horizontal surfaces by an anisotropic etch, such as an RIE.

The dielectric liner 1002 may be formed from a high-k dielectric material, where a high-material may refer to a material that has a dielectric constant greater than that of silicon dioxide. Examples of high-k dielectric materials include but are not limited to metal oxides such as silicon nitride, hafnium oxide, hafnium silicon oxide, hafnium silicon oxynitride, lanthanum oxide, lanthanum aluminum oxide, zirconium oxide, zirconium silicon oxide, zirconium silicon oxynitride, tantalum oxide, titanium oxide, barium strontium titanium oxide, barium titanium oxide, strontium titanium oxide, yttrium oxide, aluminum oxide, lead scandium tantalum oxide, and lead zinc niobate. The interlayer dielectric fill 1004 may be formed from any appropriate dielectric material, such as silicon dioxide.

Figure 11:
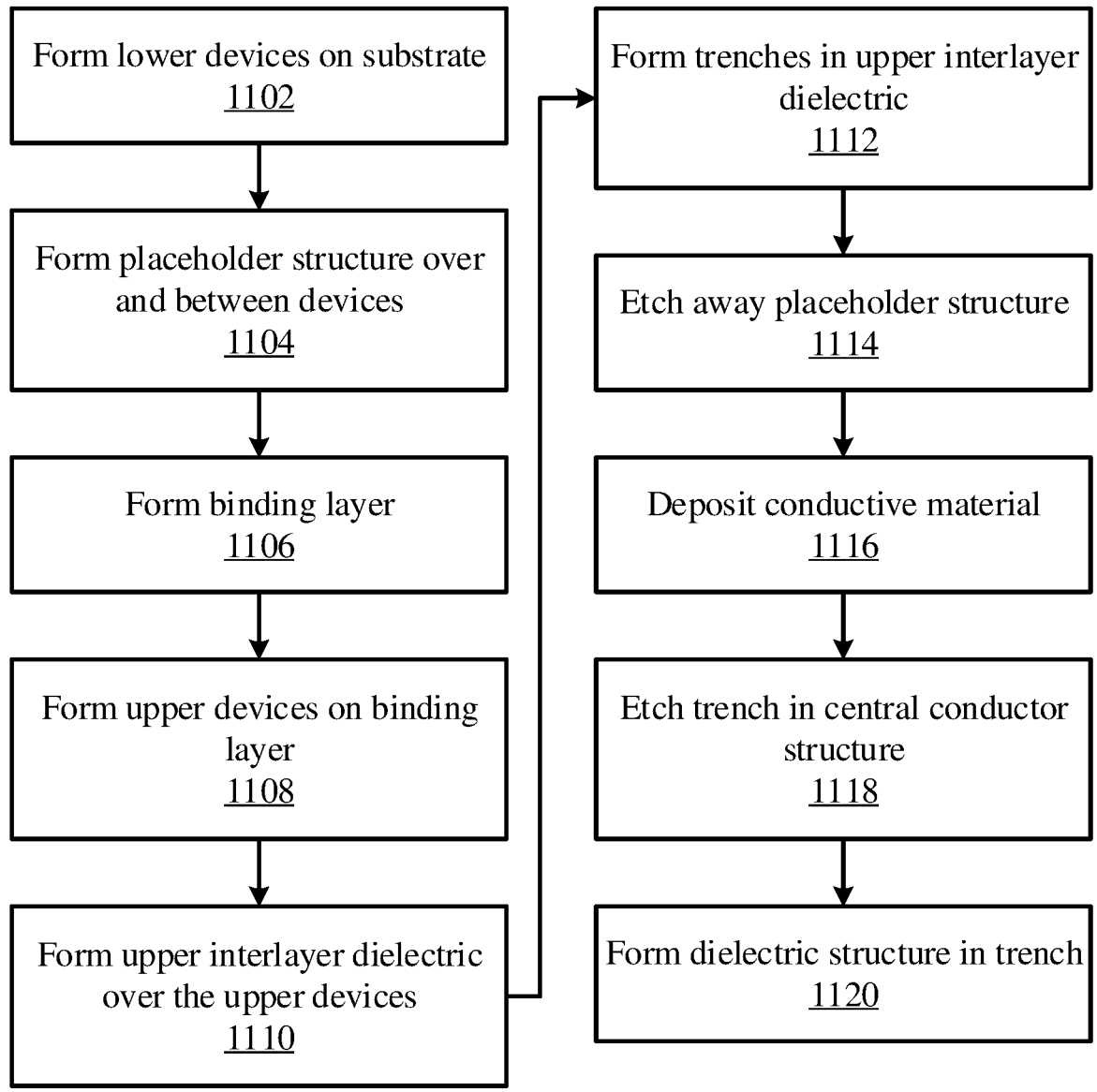
FIG. 11 is a block/flow diagram of a method of forming a semiconductor device that has vertically stacked transistor devices, in accordance with an embodiment of the present invention.

Referring now to FIG. 11, a method of fabricating stacked devices is shown. Block 1102 forms the lower devices 200 on the devices regions 104 of the substrate 102. The lower devices 200 may be any appropriate semiconductor devices, but it is specifically contemplated that such devices may include fin FETs, nanosheet FETs, or nanowire FETs. A placeholder structure 304 is formed across part of the lower devices 200 in block 1104, for example contacting the lower source/drain structures 202. An interlayer dielectric 402 may be formed over and around the placeholder structure 304.

Block 1106 forms a binding layer 404 over the placeholder structure 304, delineating a lower layer from an upper layer. Block 1108 forms upper devices 502 on the binding layer 404, which may be any appropriate semiconductor devices and which may be positioned directly over the lower devices 200. Block 1110 forms upper interlayer dielectric 504 over the upper devices 502 and block 1112 forms trenches in the upper dielectric layer 504, including upper trenches 604 and central trench 602, which expose the top surfaces of the upper devices 502 and the placeholder structure 304 respectively.

Block 1114 etches away the placeholder structure 304 using any appropriate isotropic etch, exposing top and sidewall surfaces of the lower devices 200. Block 1116 then deposits conductive material that makes electrical contact with the lower devices 200 using a conformal deposition process, forming a central conductor structure 804. Block 1118 etches a trench 902 in the central conductor structure, separating the central conductor structure 804 into two vias/contacts 904. Block 1120 then fills the trench 902 with an insulating structure that includes, e.g., a dielectric liner 1002 and a dielectric fill 1004.

Figure 12:
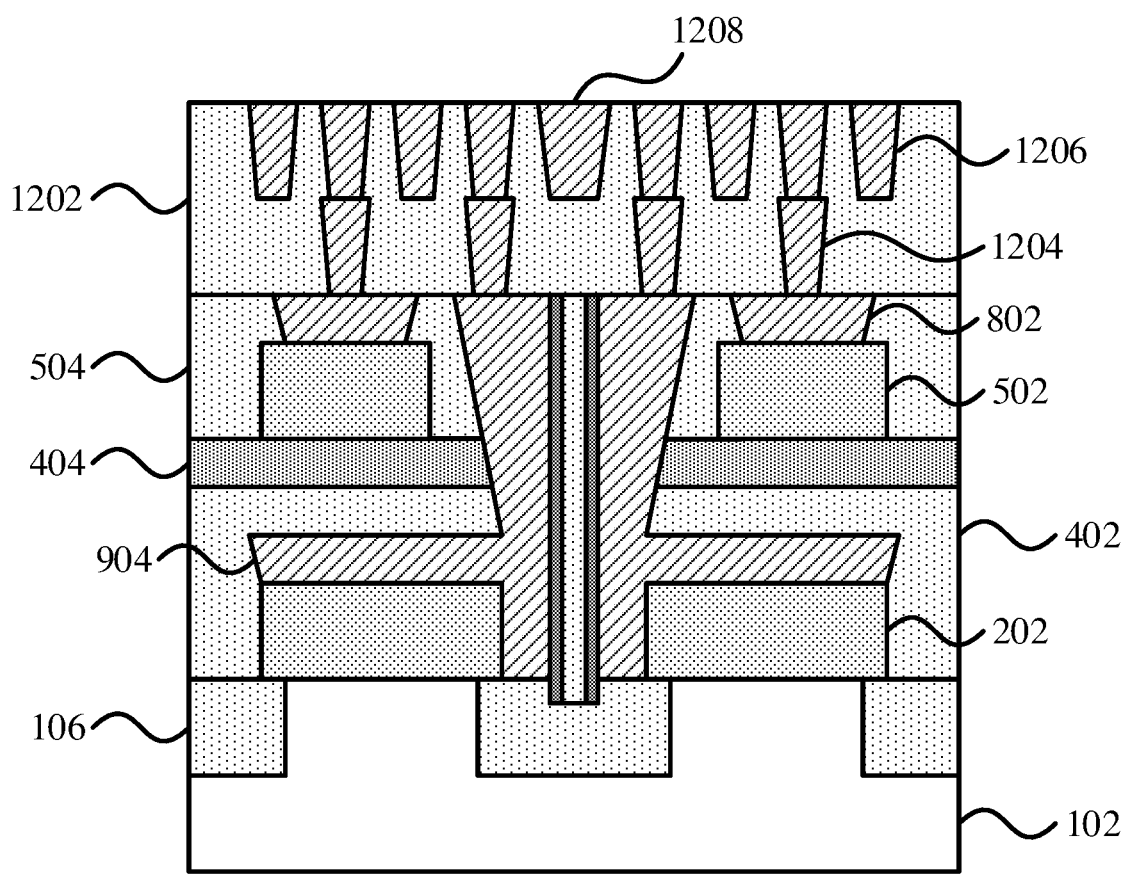
FIG. 12 is a cross-sectional view of a step in the fabrication of contacts to a set of vertically stacked semiconductor devices, showing a back-end-of-line layer in electrical communication with device contacts, in accordance with an embodiment of the present invention.

Referring now to FIG. 12, a cross-sectional view of stacked semiconductor devices is shown. In this view, a back-end-of-line (BEOL) layer includes a BEOL dielectric 1202 with metal lines 1206 and vias 1204 that connect certain of the metal lines 1206 to the contacts 802 and 904. A power rail 1208 carries either a ground voltage or operational voltage. In this embodiment, the lower contacts 904 are shown as being in electrical contact with the metal lines 1206, for example for signal communication with other devices on an integrated chip.

Figure 13:
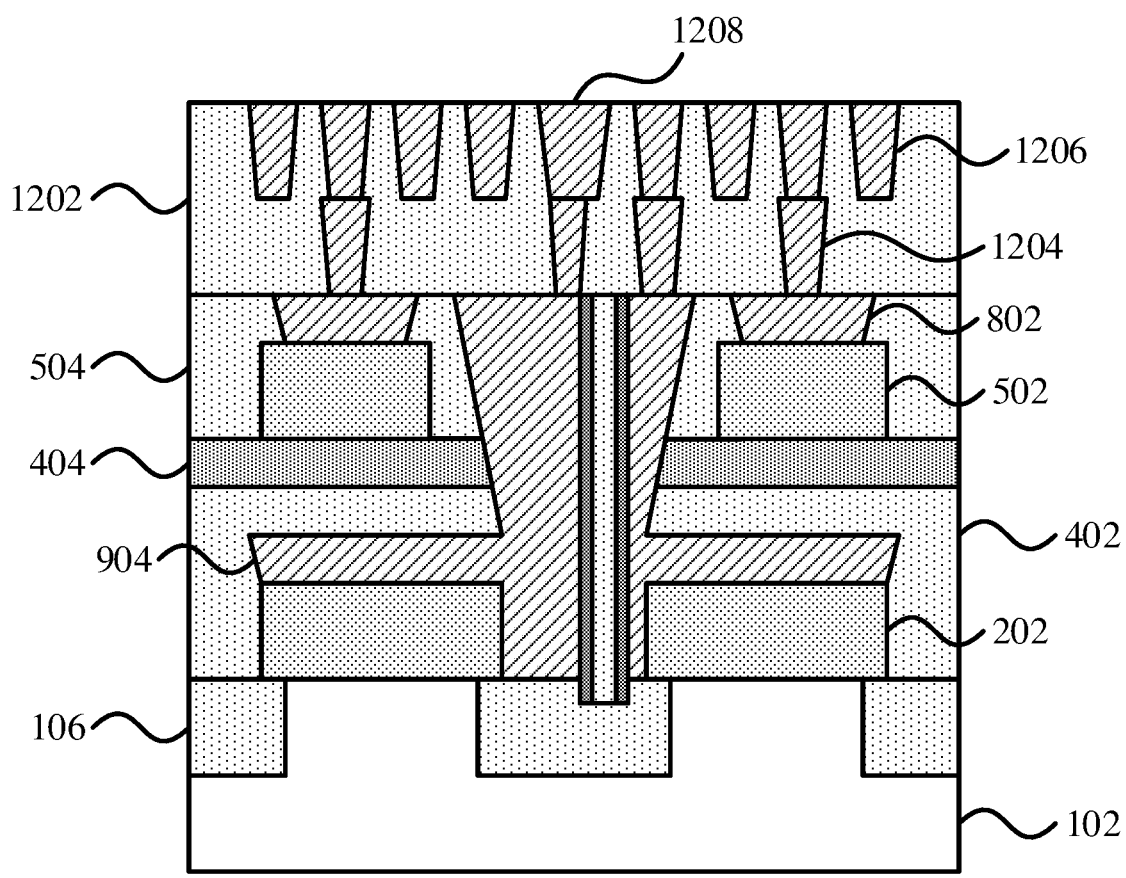
FIG. 13 is a cross-sectional view of a step in the fabrication of contacts to a set of vertically stacked semiconductor devices, showing a back-end-of-line layer in electrical communication with device contacts where the device contacts are formed off-center, in accordance with an embodiment of the present invention.

Referring now to FIG. 13, a cross-sectional view of stacked semiconductor devices is shown. In this view, the BEOL layer is shown as in FIG. 12. However, to make contact with the power rail 1208, the trench 902 and barrier structure 1002/1004 may be positioned off-center, such that one of the resulting lower contacts is wider than the other. The barrier structure 1002/1004 can be positioned at any appropriate point to facilitate contact between the a via 1204, the lower contact 904, and any appropriate conductive structure in the BEOL.

It is to be understood that aspects of the present invention will be described in terms of a given illustrative architecture; however, other architectures, structures, substrate materials and process features and steps can be varied within the scope of aspects of the present invention.

It will also be understood that when an element such as a layer, region or substrate is referred to as being "on" or "over" another element, it can be directly on the other element or intervening elements can also be present. In contrast, when an element is referred to as being "directly on" or "directly over" another element, there are no intervening elements present. It will also be understood that when an element is referred to as being "connected" or "coupled" to another element, it can be directly connected or coupled to the other element or intervening elements can be present. In contrast, when an element is referred to as being "directly connected" or "directly coupled" to another element, there are no intervening elements present.

The present embodiments can include a design for an integrated circuit chip, which can be created in a graphical computer programming language, and stored in a computer storage medium (such as a disk, tape, physical hard drive, or virtual hard drive such as in a storage access network). If the designer does not fabricate chips or the photolithographic masks used to fabricate chips, the designer can transmit the resulting design by physical means (e.g., by providing a copy of the storage medium storing the design) or electronically (e.g., through the Internet) to such entities, directly or indirectly. The stored design is then converted into the appropriate format (e.g., GDSII) for the fabrication of photolithographic masks, which typically include multiple copies of the chip design in question that are to be formed on a wafer. The photolithographic masks are utilized to define areas of the wafer (and/or the layers thereon) to be etched or otherwise processed.

Methods as described herein can be used in the fabrication of integrated circuit chips. The resulting integrated circuit chips can be distributed by the fabricator in raw wafer form (that is, as a single wafer that has multiple unpackaged chips), as a bare die, or in a packaged form. In the latter case, the chip is mounted in a single chip package (such as a plastic carrier, with leads that are affixed to a motherboard or other higher level carrier) or in a multichip package (such as a ceramic carrier that has either or both surface interconnections or buried interconnections). In any case, the chip is then integrated with other chips, discrete circuit elements, and/or other signal processing devices as part of either (a) an intermediate product, such as a motherboard, or (b) an end product. The end product can be any product that includes integrated circuit chips, ranging from toys and other low-end applications to advanced computer products having a display, a keyboard or other input device, and a central processor.

It should also be understood that material compounds will be described in terms of listed elements, e.g., SiGe. These compounds include different proportions of the elements within the compound, e.g., SiGe includes $Si_xGe_{1-x}$ where x is less than or equal to 1, etc. In addition, other elements can be included in the compound and still function in accordance with the present principles. The compounds with additional elements will be referred to herein as alloys.

Reference in the specification to "one embodiment" or "an embodiment", as well as other variations thereof, means that a particular feature, structure, characteristic, and so forth described in connection with the embodiment is included in at least one embodiment. Thus, the appearances of the phrase "in one embodiment" or "in an embodiment", as well any other variations, appearing in various places throughout the specification are not necessarily all referring to the same embodiment.

It is to be appreciated that the use of any of the following "/", "and/or", and "at least one of", for example, in the cases of "A/B", "A and/or B" and "at least one of A and B", is intended to encompass the selection of the first listed option (A) only, or the selection of the second listed option (B) only, or the selection of both options (A and B). As a further example, in the cases of "A, B, and/or C" and "at least one of A, B, and C", such phrasing is intended to encompass the selection of the first listed option (A) only, or the selection of the second listed option (B) only, or the selection of the third listed option (C) only, or the selection of the first and the second listed options (A and B) only, or the selection of the first and third listed options (A and C) only, or the selection of the second and third listed options (B and C) only, or the selection of all three options (A and B and C). This can be extended, as readily apparent by one of ordinary skill in this and related arts, for as many items listed.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises," "comprising," "includes" and/or "including," when used herein, specify the presence of stated features, integers, steps, operations, elements and/or components, but do not preclude the presence or addition of one or more other features, integers, steps, operations, elements, components and/or groups thereof.

Spatially relative terms, such as "beneath," "below," "lower," "above," "upper," and the like, can be used herein for ease of description to describe one element's or feature's relationship to another element(s) or features) as illustrated in the FIGS. It will be understood that the spatially relative terms are intended to encompass different orientations of the device in use or operation in addition to the orientation depicted in the FIGS. For example, if the device in the FIGS. is turned over, elements described as "below" or "beneath" other elements or features would then be oriented "above" the other elements or features. Thus, the term "below" can encompass both an orientation of above and below. The device can be otherwise oriented (rotated 90 degrees or at other orientations), and the spatially relative descriptors used herein can be interpreted accordingly. In addition, it will also be understood that when a layer is referred to as being "between" two layers, it can be the only layer between the two layers, or one or more intervening layers can also be present.

It will be understood that, although the terms first, second, etc. can be used herein to describe various elements, these elements should not be limited by these terms. These terms are only used to distinguish one element from another element. Thus, a first element discussed below could be termed a second element without departing from the scope of the present concept.

Having described preferred embodiments of stacked FET contact formation (which are intended to be illustrative and not limiting), it is noted that modifications and variations can be made by persons skilled in the art in light of the above teachings. It is therefore to be understood that changes may be made in the particular embodiments disclosed which are within the scope of the invention as outlined by the appended claims. Having thus described aspects of the invention, with the details and particularity required by the patent laws, what is claimed and desired protected by Letters Patent is set forth in the appended claims.

The invention claimed is:

1. A semiconductor device, comprising:
    a first lower device and a second lower device on a substrate;
    a first upper device over the first lower device and a second upper device over the second lower device;

a first lower contact that extends from a height above the first upper device and makes electrical contact with a top surface and a sidewall surface of the first lower device and that extends laterally underneath the first upper device;

a second lower contact that extends from a height above the second upper device and makes electrical contact with a top surface and a sidewall surface of the second lower device and that extends laterally underneath the second upper device; and an insulating barrier between the first lower contact and the second lower contact.

2. The semiconductor device of claim 1, wherein the insulating barrier comprises a dielectric liner and a dielectric fill formed from distinct dielectric materials.

3. The semiconductor device of claim 2, wherein the dielectric liner is formed from a high-k dielectric material and the dielectric fill is formed from silicon dioxide.

4. The semiconductor device of claim 1, wherein the first lower contact has a width that is different from a width of the second lower contact.

5. The semiconductor device of claim 1, wherein the substrate includes a shallow trench isolation (STI) region between the first lower device and the second lower device, and wherein the insulating barrier extends to a depth below a top surface of the STI region.

6. The semiconductor device of claim 1, wherein a sidewall of the first lower contact in a portion that extends laterally underneath the first upper device is sloped.

7. The semiconductor device of claim 1, wherein the first lower contact makes electrical contact with a source/drain portion of the first lower device and the second lower contact makes electrical contact with a source/drain portion of the second lower device.

8. The semiconductor device of claim 1, further comprising a back-end-of-line (BEOL) layer that includes a first line in electrical contact with the first lower contact and a second line in electrical contact with the second lower contact.

9. The semiconductor device of claim 1, wherein the first lower contact and the second lower contact lack voids.

* * * * *